Figure 1:
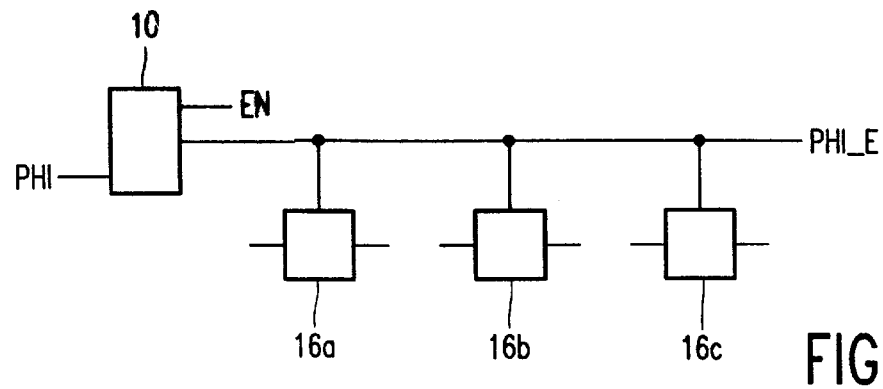

United States Patent [19]
Peset Llopis

[11] Patent Number: 6,137,331
[45] Date of Patent: Oct. 24, 2000

[54] ELECTRONIC CIRCUIT WITH DUAL EDGE TRIGGERED FLIP-FLOP

[75] Inventor: Rafael Peset Llopis, Eindhoven, Netherlands

[73] Assignee: U.S. Philips Corporation, New York, N.Y.

[21] Appl. No.: 09/184,533

[22] Filed: Nov. 2, 1998

[30] Foreign Application Priority Data

Nov. 14, 1997 [EP] European Pat. Off. ............. 97203556

[51] Int. Cl.$^7$ ..................................... H03K 3/12
[52] U.S. Cl. ........................... 327/199; 327/212; 327/18; 327/24
[58] Field of Search .................... 327/199, 212, 327/18, 24

[56] References Cited

U.S. PATENT DOCUMENTS

| | | | |
|---|---|---|---|
| 3,967,206 | 4/1999 | Roberson | 327/255 |
| 5,179,295 | 4/1999 | Mattison | 327/199 |
| 5,250,858 | 4/1999 | Strong | 326/46 |
| 5,327,019 | 4/1999 | Kluck | 327/202 |
| 5,760,609 | 4/1999 | Sharpe-Geisler | 326/93 |
| 5,793,236 | 4/1999 | Kosco | 327/218 |
| 5,844,844 | 4/1999 | Bauer | 365/189.05 |
| 5,892,373 | 4/1999 | Tupuri | 326/97 |

OTHER PUBLICATIONS

Rafael Peset Llopis and Manjov Sachdev, (International Symposium on Low Power Electronics and Design) 1996, pp. 341–345.

*Primary Examiner*—Margaret R. Wambach
*Assistant Examiner*—Cassandra Cox
*Attorney, Agent, or Firm*—Brian J. Wieghaus

[57] ABSTRACT

The electronic circuit contains dual edge triggered flip-flop, which loads data on both the rising edge and the falling edge of a clock signal. The clock signal is supplied by a clock supply circuit with an enable input and a source input for receiving a source signal. The clock supply circuit toggles the clock signal as from an earliest available edge of the source signal after the enable signal at the enable input switches to an active state, irrespective of a polarity of said earliest available edge.

3 Claims, 2 Drawing Sheets

ELECTRONIC CIRCUIT WITH DUAL EDGE TRIGGERED FLIP-FLOP

The invention relates to an electronic circuit as described in the precharacterizing part of claim 1.

Such an electronic circuit is known from an article by Rafael Peset Llopis and Manoj Sachdev, published in page 341 to 345 of the proceedings of the ISLE (International Symposium on Low Power Electronics and Design) 1996, Monterey Calif. USA. A dual edge triggered flip-flop is a flip-flop that accepts data on both rising and falling edges of a clock signal supplied to the flip-flop. This is in contrast to a single edge triggered flip-flop, which accepts data only on one predetermined type of edge of the clock signal, say on the rising edge. Thus, the dual edge triggered flip-flop can accept the same amount of data as a single edge triggered flip-flop at half the clock frequency of the single edge triggered flip-flop. This lower clock frequency allows for a considerable reduction of power consumption.

Another approach to reduction of power consumption is clock gating. Clock gating involves temporary blocking of transfer of the clock signal to selected parts of the electronic circuit. Clock gating makes it possible to avoid power consumption by signal transitions that are unnecessary for the function of the electronic circuit.

Amongst others, it is an object of the invention to reduce power consumption of an electronic circuit with at least one dual edge triggered flip-flop even further. It is another object of the invention to reduce power consumption while keeping the response time of the electronic circuit fast.

The electronic circuit according to the invention is characterized by the characterizing part of claim 1. A clock supply circuit makes it possible to gate the clock signal supplied to the dual edge triggered flip-flop. Thus, an even greater reduction of power consumption can be achieved.

A source signal is passed to the clock input when the enable signal is in an active state. As soon as the enable signal becomes active the next edge of the source signal that can be handled results in an edge of the clock signal. Depending on whether the clock signal was low or high at the time when the enable signal was active, the polarity of this edge in the clock signal may be a rising or a falling transition, irrespective of whether the polarity of the edge in the source signal that causes this edge in the clock signal is a rising or a falling transition. Thus, the clock supply circuit does not need to wait for a specific type of edge in the source signal before it starts producing edges in the clock signal after the enable signal becomes active and no time (edge) is lost after the enable signal becomes active.

Claim 2 specifies an embodiment of the electronic circuit according to the invention. In this embodiment the clock supply circuit is realized in a very simple way using a further dual edge triggered flip-flop and a logic circuit with exclusive or function.

The invention is particularly suited to electronic circuits in which different enable signals are used to supply different clocks to different parts of the electronic circuits, so that the dual edge triggered flip-flops in those different parts take up data only when this is necessary for the function of the circuit.

Figure 2:
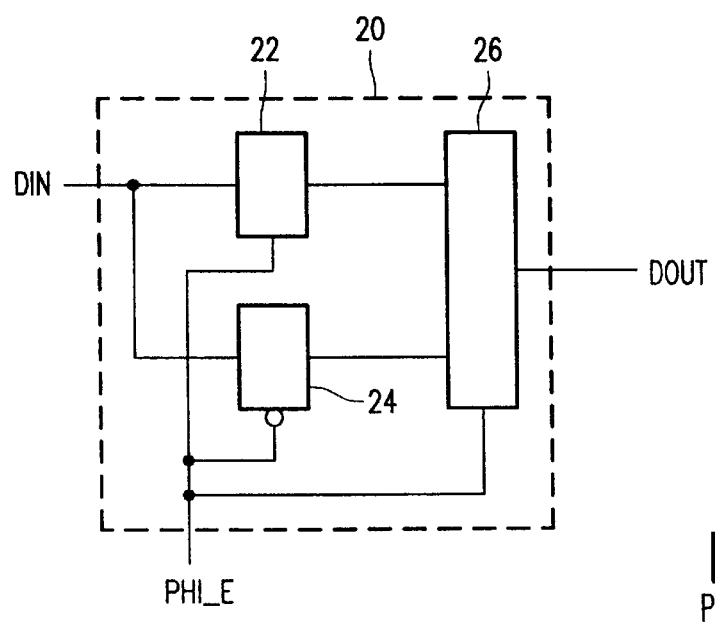
Figure 3:
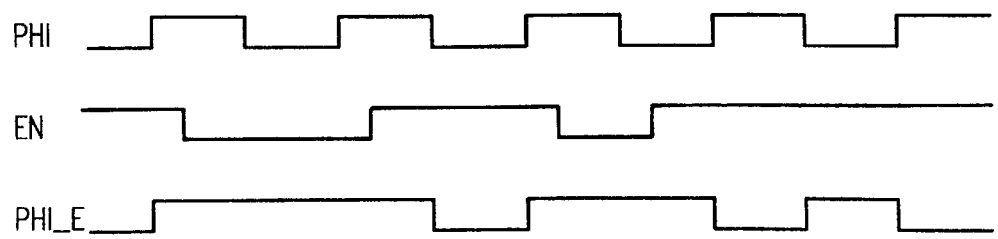
Figure 4:
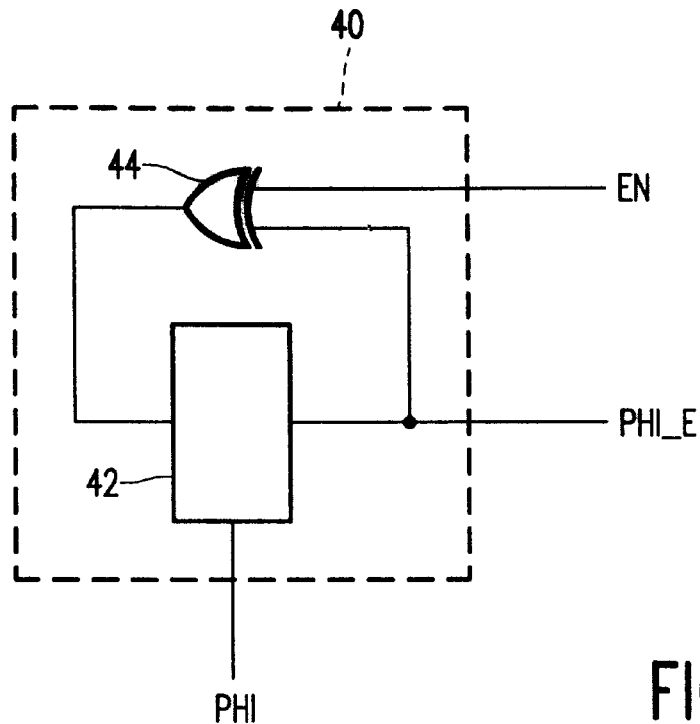
Figure 5:
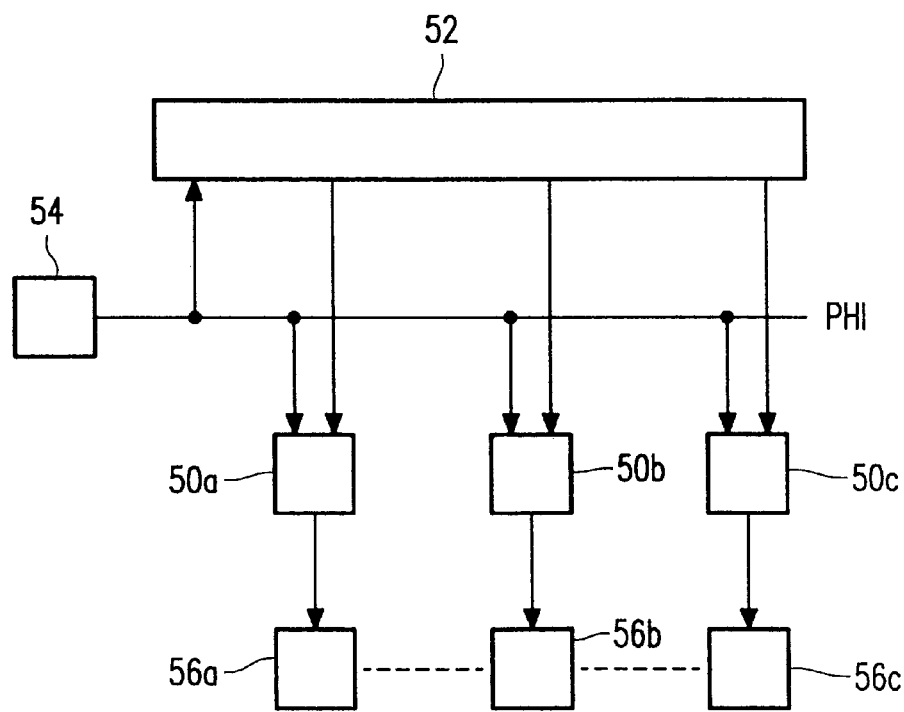

These and other advantageous aspects of the invention will be described in a non-limitative way, using the following figures FIG. 1 shows an electronic circuit according to the invention FIG. 2 shows an example of an embodiment of a dual edge triggered flip-flop FIG. 3 shows two clock signals and an enable signal FIG. 4 shows a clock supply circuit FIG. 5 shows a further electronic circuit according to the invention FIG. 1 shows an electronic circuit containing a clock supply circuit 10 and a number of dual edge triggered flip-flops 16a–c. The clock supply circuit 10 has an enable input EN, a clock source input PHI and a clock output PHI_E. The clock output PHI_E is coupled to respective clock inputs of the dual edge triggered flip-flops 16a–c. The dual edge triggered flip-flops have data-inputs and outputs which will generally be connected to logic circuitry (not shown).

Dual edge triggered flip-flops 16a–c are flip-flops that accept data on both the rising edge and the falling edge of a clock signal. This function can be realized in many ways known per se from the prior art.

FIG. 2 shows an example of an embodiment of a dual edge triggered flip-flop 20. The dual edge triggered flip-flop 20 contains a first and second single edge triggered flip-flop 22, 24 and a multiplexer 26. Each single edge triggered flip-flop 22, 24 has a data input and a data output. The data inputs of the single edge triggered flip-flops 22, 24 are connected to each other and to a data input of the dual edge triggered flip-flop 20. The data outputs of the single edge triggered flip-flops are coupled to respective inputs of the multiplexer 26. An output of the multiplexer 26 is coupled to a data output of the dual edge triggered flip-flop 20. A clock input of the dual edge triggered flip-flop 20 is coupled to a clock input of the first single edge triggered flip-flop 22, to an inverted clock input of the second single edge triggered flip-flop 24 and to a select input of the multiplexer 26.

In operation, the first single edge triggered flip-flop 22 loads data from the data input on each rising edge of the clock signal supplied to the dual edge triggered flip-flop 20. The multiplexer 26 passes data loaded into the first single edge triggered flip-flop 22 to the data-output of the dual edge triggered flip-flop 20 when the clock signal is low. The second single edge triggered flip-flop 24 loads data from the data input on each falling edge of the clock signal supplied to the dual edge triggered flip-flop 20. The multiplexer 26 passes data loaded into the second single edge triggered flip-flop 24 to the data-output of the dual edge triggered flip-flop 20 when the clock signal is high. Thus data is loaded on both rising and falling edges of the clock signal and passed to the output.

If it is desired to incorporate the dual edge triggered flip-flop 20 into a scan-test chain, this may be realized in a very simple way by inserting an additional multiplexer (not shown) between the data input DIN of the dual edge triggered flip-flop 20 and the data inputs of the single edge triggered flip-flops 22, 24. In this case, a number of dual edge triggered flip-flops in the electronic circuit are connected in cascade in a scan chain. One input of the additional multiplexer receives the data input of the dual edge triggered flip-flop 20 and the other receives the data-output of a predecessor dual edge triggered flip-flop in the scan chain. The output of the additional multiplexer is coupled to the data inputs of the single edge triggered flip-flops 22, 24. A test enable signal controls the additional multiplexer, and switches this additional multiplexer between a test state and a normal state. In the normal state the data input of the dual edge triggered flip-flop is coupled to the data inputs of the single edge triggered flip-flops and in the test state, the output of the predecessor in the scan chain is coupled to the data inputs of the single edge triggered flip-flops. In the test state data is passed through the scan chain on both rising and falling edges of the clock signal.

The clock supply circuit 10 of FIG. 1 supplies the clock signal to the dual edge triggered flip-flops 16a–c when it receives an active enable signal.

Dual edge triggered flip-flop can be realized in many other ways, for example by using level sensitive flip-flops (having transparent/hold mode dependent on the level of the clock) instead of single edge triggered flip-flops 22, 24.

FIG. 3 shows a source clock signal PHI supplied to the clock source input PHI of the clock supply circuit 10, an enable signal EN supplied to the enable input EN of the clock supply circuit 10 and an output clock signal PHI_E produced at the output of the clock supply circuit 10. The source clock signal PHI is a periodic binary signal. The enable signal EN indicates when the source clock signal PHI must be used to produce edges in the output clock signal PHI_E. When the enable signal EN is low (passive state) no edges are produced in the output clock signal PHI_E. When the enable signal EN is high (active) an edge is produced in the output clock signal PHI_E each time there is a transition in the source clock signal PHI.

Note that a rising edge in the source clock signal PHI may give rise to a rising edge or a falling edge in the output clock signal PHI_E. This depends on the level assumed by the output clock signal PHI at the instant when the enable signal EN becomes active. Each time the enable signal EN remains passive during an odd number of transitions of the source clock signal PHI, the correspondence between rising and falling of the source clock signal and rising and falling of the output clock signal changes.

FIG. 4 shows an example of a clock supply circuit 40 which realizes the signals of FIG. 3. The clock supply circuit 40 contains a dual edge triggered flip-flop 42 and an exclusive or gate 44. A clock input PHI is coupled to the clock input of the dual edge triggered flip-flop 42. A data output of the dual edge triggered flip-flop 42 is coupled to the clock output PHI_E of the clock supply circuit 40 and to an input of the exclusive or gate 44. The enable input EN of the clock supply circuit 40 is coupled to another input of the exclusive or gate 44. An output of the exclusive or gate 44 is coupled to a data input of the dual edge triggered flip-flop 42.

In operation when the enable signal is logic high, the exclusive or gate 44 will supply the logic inverse of the data output signal PHI_E of the dual edge triggered flip-flop 42 to the data input of that flip-flop 42, causing the flip-flop 42 to toggle at each edge of the source clock signal PHI. When the enable signal is logic low, the exclusive or gate 44 will supply the logic equivalent of the data output signal PHI_E to the data input of the dual edge triggered flip-flop 42, causing that flip-flop 42 to keep producing the same logic level, low or high, whichever pertained at the instant when the enable signal last went logic low.

Of course, the same effect may be realized by many logical variants, for example by coupling an inverted output of the dual edge triggered flip-flop 42 to its data-input via a "not exclusive or gate" instead of via the exclusive or gate 42.

Instead of the clock supply circuit of FIG. 4, one may also use a circuit intended for gating the clock to single edge triggered flip-flops, e.g. a circuit comprising an AND gate and a D-flip-flop, the input clock signal being supplied to an input of the AND gate and a clock input of the D-flipflop, the enable signal being supplied to a data input of the D-flip-flop, a data output of the D-flip-flop being connected to a further input of the AND gate. However, such a circuit switches between a selected state and a non-selected state only on one type of edge and requires more care with the timing of transitions in the enable signal.

FIG. 5 shows a further electronic circuit according to the invention. This electronic circuit contains a clock source 54, a control circuit 52, a number of clock supply circuits 50a–c and a number of functional circuits 56a–c. The clock supply circuits 50a–c all receive the same source clock signal PHI from the clock source 54. A control circuit 52 supplies independent enable signals to the various clock supply circuits 50a–c. Each clock supply circuit 50a–c has a clock output coupled to a respective one of the functional circuits 56a–c. The functional circuits 56a–c each contain one or more dual edge triggered flip-flops (not shown) which receive their clock signals from the relevant clock supply circuit 50a–c.

In operation, the functional circuits 56a–c perform various functions, which involve outputting data from the dual edge triggered flip-flops contained in the functional circuit, performing a combinatorial logic function on data output by the dual edge triggered flip-flops and loading a result of that combinatorial logic function and/or other inputs into the dual edge triggered flip-flops. Results or data from dual edge triggered flip-flops may also be passed from one functional circuit 56a–c to another, to be loaded into one or more dual edge triggered flip-flops in that other functional circuit 56a–c.

The control circuit 52 determines the function to be performed by the electronic circuit and determines when it is necessary for that function that data should be loaded into any dual edge triggered flip-flop in a particular one of the functional circuits. If loading is necessary in a particular one of the functional circuits 56a–c, the control circuit supplies an active enable signal to the clock supply unit associated with that particular functional circuit 56a–c. If no loading is needed, the enable signal is made passive.

The control circuit may for example be a microcontroller which steps through successive states which control the enable signals and the functional circuits 56a–c (via connections not shown).

What is claimed is:

1. Electronic circuit comprising
at least one dual edge triggered flip-flop having a clock input,
a clock supply circuit for feeding a clock signal to the clock input,
characterized in that the clock supply circuit has an enable input for an enable signal, and a source input for receiving a source signal, the clock supply circuit toggling the clock signal from an earliest available edge of the source signal after said enable signal switches to an active state, irrespective of a polarity of said earliest available edge.

2. Electronic circuit according to claim 1, the clock supply circuit comprising a logic circuit and a further dual edge triggered flip-flop having a further clock input, a data input and a flip-flop output which supplies the clock signal, the source signal being fed to the further clock input of the further dual edge triggered flip-flop, the logic circuit being arranged to form an exclusive or of the enable signal and the clock signal, and to supply said exclusive or to the data input.

3. Electronic circuit according to claim 1, wherein said at least one dual edge triggered flip-flop and the clock supply circuit are referred to as the first dual edge triggered flip-flop and the first clock supply circuit respectively, the electronic circuit comprising a second dual edge triggered flip-flop and a second clock supply circuit for feeding a further clock signal to a clock input of the second dual edge triggered flip-flop, the first and second clock supply circuit receiving the same source signal, the electronic circuit comprising a control circuit for generating mutually different enable signals for the first and second clock supply circuit, so as to restrict activity of the first and second dual edge triggered flip-flops to time intervals in which relevant data needs to be stored by these flip-flops respectively.

* * * * *